(12) United States Patent
Shao et al.

(10) Patent No.: US 12,224,746 B2
(45) Date of Patent: Feb. 11, 2025

(54) IMPEDANCE CALIBRATION CIRCUIT

(71) Applicant: CHANGXIN MEMORY TECHNOLOGIES, INC., Hefei (CN)

(72) Inventors: Yanian Shao, Hefei (CN); Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/154,798

(22) Filed: Jan. 14, 2023

(65) Prior Publication Data

US 2024/0039535 A1 Feb. 1, 2024

Related U.S. Application Data

(63) Continuation of application No. PCT/CN2022/112658, filed on Aug. 16, 2022.

(30) Foreign Application Priority Data

Jul. 27, 2022 (CN) .................. 202210893495.X

(51) Int. Cl.
*H03K 19/00* (2006.01)
*G11C 7/10* (2006.01)

(52) U.S. Cl.
CPC ....... *H03K 19/0005* (2013.01); *G11C 7/1048* (2013.01); *G11C 2207/2254* (2013.01)

(58) Field of Classification Search
CPC ....... H03K 19/0005; H03K 19/017545; H03K 19/01825; H03K 19/018557;

(Continued)

(56) References Cited

U.S. PATENT DOCUMENTS

2009/0289659 A1 11/2009 Kuwahara et al.
2010/0188102 A1 7/2010 Kaiwa et al.
(Continued)

FOREIGN PATENT DOCUMENTS

CN 1499798 A 5/2004
CN 106059579 A 10/2016
(Continued)

OTHER PUBLICATIONS

European Patent Office, Extended European Search Report Issued in Application No. 22865916.5, Jun. 19, 2024, Germany, 9 pages.

(Continued)

*Primary Examiner* — Jung Kim
(74) *Attorney, Agent, or Firm* — Kilpatrick Townsend & Stockton LLP

(57) ABSTRACT

An impedance calibration circuit including: a calibration circuit configured to receive a first calibration clock signal, to perform impedance calibration on a basis of the first calibration clock signal, and to output a first stop signal when the calibration is completed; a first detection circuit configured to detect calibration time of the impedance calibration circuit, and to output a second stop signal when the calibration time reaches a preset value; and a calibration control circuit configured to receive the first stop signal and the second stop signal and to output the first calibration clock signal. When the first stop signal or the second stop signal is received, the calibration control circuit stops outputting the first calibration clock signal.

14 Claims, 5 Drawing Sheets

(58) Field of Classification Search
CPC . G11C 7/1048; G11C 2207/2254; G11C 7/22;
G11C 29/028; G06F 13/4086; H05K
1/0246
See application file for complete search history.

(56) References Cited

U.S. PATENT DOCUMENTS

| | | |
|---|---|---|
| 2010/0207680 A1 | 8/2010 | Kuwahara et al. |
| 2015/0226825 A1 | 8/2015 | Kaiwa et al. |
| 2019/0221245 A1* | 7/2019 | Arai .................... G11C 29/028 |

FOREIGN PATENT DOCUMENTS

| | | | |
|---|---|---|---|
| CN | 109660254 | A | 4/2019 |
| CN | 109873641 | A | 6/2019 |
| CN | 214205481 | U | 9/2021 |
| CN | 114420187 | A | 4/2022 |
| JP | 2010171793 | A | 8/2010 |
| JP | 2010193291 | A | 9/2010 |
| JP | 2013081079 | A | 5/2013 |

OTHER PUBLICATIONS

Japanese Patent Office, Office Action Issued in Application No. 2022-572751, Sep. 10, 2024, 6 pages.
Korean Intellectual Property Office, Office Action Issued in Application No. 10-2023-7005547, Dec. 9, 2024, 11 pages.

* cited by examiner

IMPEDANCE CALIBRATION CIRCUIT

CROSS-REFERENCE TO RELATED APPLICATION

This application is a continuation of PCT/CN2022/112658, filed on Aug. 16, 2022, which claims priority to Chinese Patent Application No. 202210893495.X, titled "IMPEDANCE CALIBRATION CIRCUIT" and filed on Jul. 27, 2022, the entire contents of which are incorporated herein by reference.

TECHNICAL FIELD

The present disclosure relates to the field of integrated circuit, and more particularly, to an impedance calibration circuit.

BACKGROUND

With increase of operating speed of an electronic device, swing width of a signal transmitted between semiconductor memory devices in the electronic device decreases to minimize delay time taken to transmit the signal. However, with decrease of the swing width of the transmitted signal, signal transmission is affected by external noise to a greater extent. If there is an impedance mismatch at an interface, the external noise may affect reflection characteristics of an output signal. The impedance mismatch is caused by the external noise or by variations in power supply voltage, operating temperature, and manufacture process. If the impedance mismatch occurs, it is difficult to transmit data at a high speed because the impedance mismatch may distort the data from a semiconductor device. Therefore, failure of setting/holding or misjudgment of a signal level may be caused in the semiconductor device that receives distorted data.

To mitigate these disadvantages, a memory device may include an on-die termination (ODT, also referred to as "on-die termination resistor") that may be configured to provide an adjustable termination impedance value. For example, when the signal (such as a command, data, etc.) is provided to the memory device, the impedance value of the on-die termination may be adjusted to reduce the impedance mismatch.

In a high-speed dynamic random access memory (DRAM), impedance calibration is generally performed periodically to adjust the impedance value of the on-die termination, thereby facilitating impedance matching, and maintaining and calibrating signal integrity and a data window in real time. An integrated circuit design specification requires that an impedance calibration circuit needs to complete calibration within a set time. However, an existing impedance calibration circuit cannot complete calibration in time and cannot meet requirements.

SUMMARY

Embodiments of the present disclosure provide an impedance calibration circuit.

The embodiments of the present disclosure provide an impedance calibration circuit, including: a calibration circuit configured to receive a first calibration clock signal, to perform impedance calibration on a basis of the first calibration clock signal, and to output a first stop signal when the calibration is completed; a first detection circuit configured to detect calibration time of the impedance calibration circuit, and to output a second stop signal when the calibration time reaches a preset value; and a calibration control circuit configured to receive the first stop signal and the second stop signal and to output the first calibration clock signal. When the first stop signal or the second stop signal is received, the calibration control circuit stops outputting the first calibration clock signal.

DETAILED DESCRIPTION

Implementations of an impedance calibration circuit provided by embodiments of the present disclosure are described in detail below with reference to the accompanying drawings.

Figure 1:
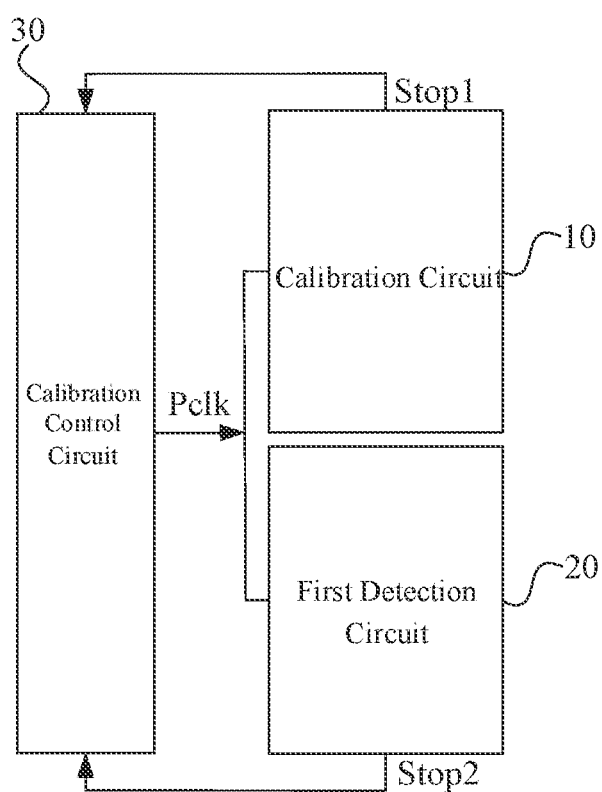
FIG. 1 is a schematic diagram of an impedance calibration circuit provided by an embodiment of the present disclosure.

FIG. 1 is a schematic diagram of an impedance calibration circuit provided by an embodiment of the present disclosure. Referring to FIG. 1, the impedance calibration circuit includes a calibration circuit 10, a first detection circuit 20, and a calibration control circuit 30. The calibration circuit 10 is configured to receive a first calibration clock signal Pclk, to perform impedance calibration on a basis of the first calibration clock signal Pclk, and to output a first stop signal Stop1 when the calibration is completed. The first detection circuit 20 is configured to detect calibration time of the impedance calibration circuit, and to output a second stop signal Stop2 when the calibration time reaches a preset value. The calibration control circuit 30 is configured to receive the first stop signal Stop1 and the second stop signal Stop2 and to output the first calibration clock signal Pclk. When the first stop signal Stop1 or the second stop signal Stop2 is received, the calibration control circuit 30 stops outputting the first calibration clock signal Pclk.

The calibration circuit 10 cannot output the valid first stop signal Stop1 in time, such that the impedance calibration circuit cannot stop outputting the first calibration clock signal Pclk in time. That is, the impedance calibration circuit cannot stop calibration in time, the calibration time of the impedance calibration circuit exceeds the design requirement and cannot meet the demands, and higher power consumption is caused. Therefore, the impedance calibration circuit provided by the embodiments of the present disclosure further provides the second stop signal Stop2, and the calibration control circuit 30 also stops outputting the first calibration clock signal Pclk according to the second stop signal Stop2 in addition to stopping outputting the first calibration clock signal Pclk according to the first stop signal Stop1. The second stop signal Stop2 is generated when the calibration time reaches the preset value. When the first stop signal Stop1 is still an invalid signal when the calibration time of the impedance calibration circuit reaches the preset value, the impedance calibration circuit stops outputting the first calibration clock signal Pclk according to the second stop signal Stop2. When the first stop signal Stop1 is a valid signal when or before the calibration time of the impedance calibration circuit reaches the preset value, the impedance calibration circuit stops outputting the first calibration clock signal Pclk according to the first stop signal Stop1, such that the impedance calibration circuit may stop calibration in time. In this way, the calibration time of the impedance calibration circuit meets the design requirement, the power consumption is effectively reduced, and reliability of the impedance calibration circuit is improved.

Figure 2:
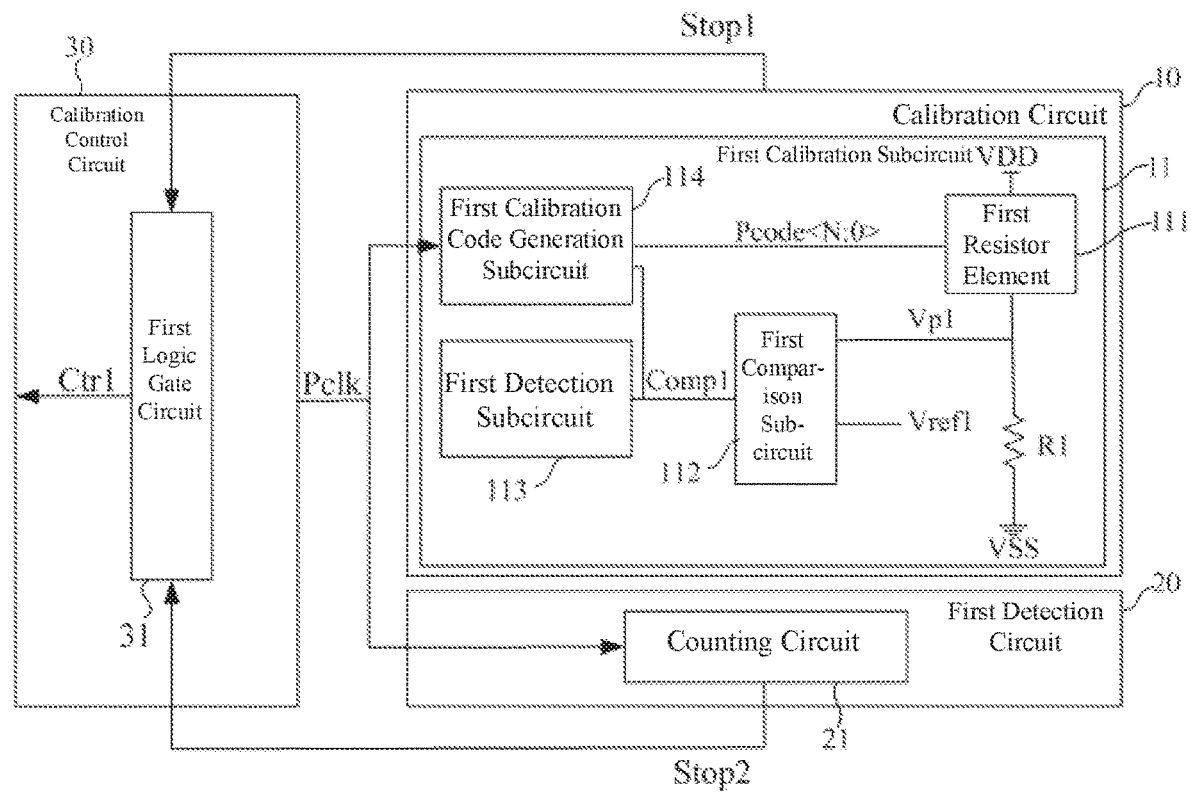
FIG. 2 is a schematic diagram of an impedance calibration circuit provided by another embodiment of the present disclosure.

FIG. 2 is a schematic diagram of an impedance calibration circuit provided by another embodiment of the present disclosure. Referring to FIG. 2, in this embodiment, the first detection circuit 20 includes a counting circuit 21, where the counting circuit 21 counts the first calibration clock signal Pclk, and outputs the second stop signal Stop2 when the count value reaches the preset value. That is, in this embodiment, the first detection circuit 20 obtains the calibration time for detecting the impedance calibration circuit by counting the first calibration clock signal Pclk, where the count value is number of cycles of the first calibration clock signal Pclk. In other embodiment, for example, referring to FIG. 6, the first detection circuit 20 obtains the calibration time for detecting the impedance calibration circuit by counting the initial clock signal CLK-0 of the clock signal generation circuit 40, and outputs the second stop signal Stop2 when the count value reaches the preset value, where the count value is the number of cycles of the initial clock signal CLK-0.

The preset value may be determined according to the design requirements. For example, in an embodiment, when it is required that the calibration time of the impedance calibration circuit does not exceed forty clock cycles, the preset value is less than or equal to forty clock cycles of the first calibration clock signal Pclk. For example, in this embodiment, when the preset value is forty clock cycles of the first calibration clock signal Pclk, the counting circuit 21 counts the clock cycles of the first calibration clock signal Pclk, and outputs the second stop signal Stop2 when the count value is 40. That is, when the count value is 40, a logic level of an output signal from the counting circuit 21 changes to a high level. That is, the logic level of the second stop signal Stop2 changes to the high level, such that the second stop signal Stop2 is the valid signal, and the calibration control circuit 30 can stop outputting the first calibration clock signal Pclk according to the second stop signal Stop2. In other cases, the logic level of the second stop signal Stop2 outputted by the counting circuit 21 is a low level, such that the second stop signal Stop2 is the invalid signal, and the calibration control circuit 30 cannot stop outputting the first calibration clock signal Pclk according to the second stop signal Stop2.

It is to be understood that in some other embodiments, to ensure that the impedance calibration circuit can stop outputting the calibration clock signal in time, the preset value may also be other values smaller than the design requirement. For example, the preset value is less than forty clock cycles to ensure that the impedance calibration circuit can stop outputting the calibration clock signal in time.

In some embodiments, the calibration control circuit 30 may stop outputting the first calibration clock signal Pclk via logic operation when the first stop signal Stop1 or the second stop signal Stop2 is received. In some embodiments, the calibration control circuit 30 includes a first logic gate circuit 31, where the first logic gate circuit 31 is configured to receive the first stop signal Stop1 and the second stop signal Stop2, and to perform logic operation processing to output a first control signal Ctrl. The calibration control circuit 30 is configured to stop outputting the first calibration clock signal Pclk according to the first control signal Ctrl.

For example, in this embodiment, the first logic gate circuit 31 includes an OR gate, the first stop signal Stop1 and the second stop signal Stop2 are used as input signals of the OR gate, the OR gate is configured to output the first control signal Ctrl, and the calibration control circuit 30 stops outputting the first calibration clock signal Pclk according to the first control signal Ctrl. When the logic level of the first stop signal Stop1 or the second stop signal Stop2 is the high level (that is, the first stop signal Stop1 or the second stop signal Stop2 is valid), the logic level of the first control signal Ctrl is the high level. In this case, the calibration control circuit 30 stops outputting the first calibration clock signal Pclk. When the logic level of the first stop signal Stop1 and the logic level of the second stop signal Stop2 are both low levels (that is, the first stop signal Stop1 and the second stop signal Stop2 are both invalid), the calibration control circuit continues outputting the first calibration clock signal Pclk.

In this embodiment, the calibration circuit 10 includes a first calibration subcircuit 11. The calibration circuit 10 is configured to perform impedance calibration on the first calibration subcircuit 11 when the first calibration clock signal Pclk is received. The first detection circuit 20 is further configured to detect calibration time of the first calibration subcircuit 11, and output the second stop signal Stop2 when the calibration time of the first calibration subcircuit 11 reaches a preset value. In some embodiments, the counting circuit 21 is configured to count the first calibration clock signal Pclk, and output the second stop signal Stop2 when a count value reaches a preset value.

The first calibration subcircuit 11 includes a first resistor element 111, a reference resistor R1, a first comparison subcircuit 112, and a first detection subcircuit 113.

A first terminal of the first resistor element 111 is connected to a first power terminal VDD. A first terminal of the reference resistor R1 is connected to a second terminal of the first resistor element 111, and a second terminal of the reference resistor R1 is connected to a second power terminal VSS. The first comparison subcircuit 112 is configured to compare a second terminal voltage Vp1 of the first resistor element 111 with a first reference voltage Vref1, and to output a first comparison signal Comp1. The first detection subcircuit 113 is configured to determine the first comparison signal Comp1 as an input signal, to record change of the first comparison signal Comp1, and to output the first stop signal Stop1 when the change of the first comparison signal Comp1 meets a preset condition. The change of the first comparison signal Comp1 refers to the change of the logic level of the first comparison signal Comp1. The preset condition may include whether the logic level of the first comparison signal Comp1 continues to change from a second value to a first value after changing from the first value to the second value. In some embodiments, the first value may represent the logic high level, and its true value may be "1"; and the second value may represent the logic low level, and its true value may be "0". In some other embodiments, the first value may represent the logic low level, and its true value may be "0"; and the second value may represent the logic high level, and its true value may be "1". When the logic level of the first comparison signal Comp1 continues to change from the second value to the first value after changing from the first value to the second value. That is, the logic level of the first comparison signal Comp1 jitters between the high level and the low level. In this case, the change of the first comparison signal Comp1 meets the preset condition, and the first detection subcircuit 113 outputs the first stop signal Stop1.

In this embodiment, the first resistor element 111 may include a plurality of metal oxide semiconductor (MOS) transistors connected in parallel, and the MOS transistors include but are not limited to P-channel Metal Oxide Semiconductor (PMOS) transistors. Turn-on or turn-off of the MOS transistor is adjusted via a first calibration code Pcode<N:0> to control an equivalent resistance of the first resistor element 111. The second terminal voltage Vp1 of the first resistor element 111 changes with the change of the equivalent resistance of the first resistor element 111. The reference resistor R1 is a fixed-value resistor with an accurate resistance, and its resistance is, for example, 240 ohms. The equivalent resistance of the first resistor element 111 may be calibrated according to the reference resistor R1. In this embodiment, the first reference voltage Vref1 may be set to be VDD/2. In other embodiment, the first reference voltage Vref1 may be set to be other values.

Figure 3:
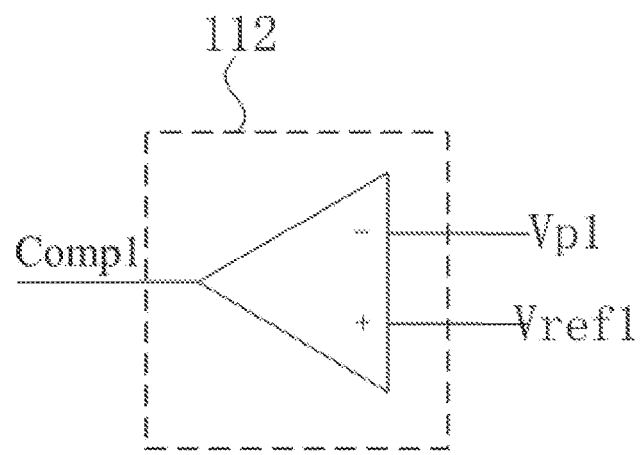
FIG. 3 is a schematic diagram of a first comparison subcircuit provided by another embodiment of the present disclosure.

In this embodiment, the first comparison subcircuit 112 may be a comparator. Referring to FIG. 3, the first comparison subcircuit 112 is a comparator. A positive input terminal of the comparator is configured to receive the first reference voltage Vref1, and a negative input terminal of the comparator is connected to the first resistor element 111 to receive the second terminal voltage Vp1 of the first resistor element 111. The comparator is configured to output the first comparison signal Comp1 in response to the second terminal voltage Vp1 of the first resistor element 111 and the first reference voltage Vref1. When the second terminal voltage Vp1 of the first resistor element 111 is lower than the first reference voltage Vref1, the logic level of the first comparison signal Comp1 outputted by the output terminal of the comparator is the high level. When the second terminal voltage Vp1 of the first resistor element 111 is greater than the first reference voltage Vref1, the logic level of the first comparison signal Comp1 outputted by the output terminal of the comparator is the low level.

The first detection subcircuit 113 determines the first comparison signal Comp1 as the input signal, and outputs the first stop signal Stop1. That is, the first stop signal Stop1 is generated on the basis of the first comparison signal Comp1. However, when the first comparison subcircuit 112 has a lower sensitivity, the first comparison subcircuit 112 cannot output the first comparison signal Comp1 or outputs an incorrect first comparison signal (because the second terminal voltage Vp1 of the first resistor element 111 is closer to the first reference voltage Vref1, the first comparison subcircuit 112 cannot distinguish between the two voltages, and thus cannot output the valid first comparison signal Comp1). Consequently, the impedance calibration circuit cannot generate the first stop signal Stop1 in time, and thus the impedance calibration circuit cannot stop calibration in time. As above, in addition to stopping the impedance calibration process according to the first stop signal Stop1, the calibration control circuit 30 also stops the impedance calibration process according to the second stop signal Stop2, such that the impedance calibration circuit can stop the calibration in time. In this way, the calibration time of the impedance calibration circuit meets the design requirement, the power consumption is effectively reduced, and the reliability of the impedance calibration circuit is improved.

As an example, an embodiment of the present disclosure provides a structure of the first detection subcircuit 113. The first detection subcircuit 113 includes an odd number of flip-flops cascaded and a second logic gate circuit, where first output terminals of the flip-flops of odd-numbered stages are connected to an input terminal of the second logic gate circuit, second output terminals of the flip-flops of even-numbered stages are connected to the input terminal of the second logic gate circuit, and the first stop signal is outputted after logic processing of the second logic gate circuit.

Figure 4A:
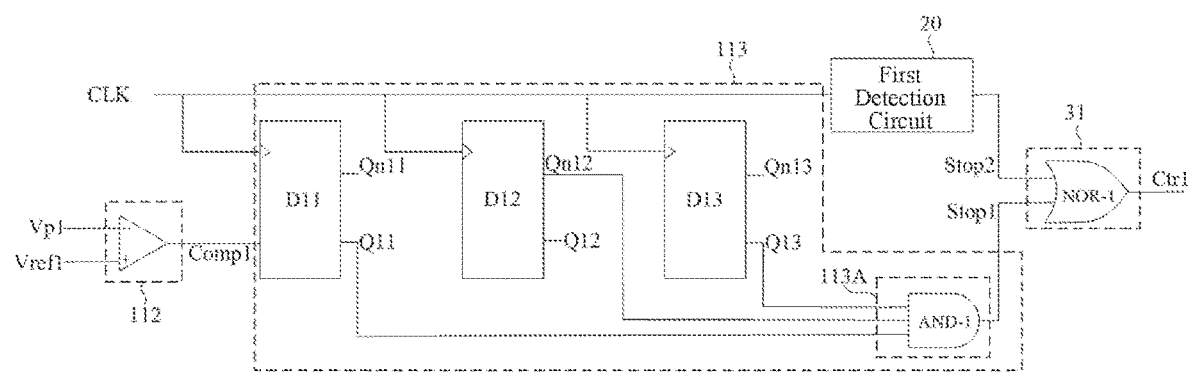
FIG. 4A is a schematic diagram of a first detection subcircuit provided by another embodiment of the present disclosure.

In some embodiments, referring to FIG. 4A, which is a schematic diagram of the first detection subcircuit 113 according to an embodiment of the present disclosure. In this embodiment, the first detection subcircuit 113 includes a flip-flop D11, a flip-flop D12, a flip-flop D13 and a second logic gate circuit 113A, where the flip-flop D11, the flip-flop D12 and the flip-flop D13 are cascaded. A first output terminal Q11 of the flip-flop D11 and a first output terminal Q13 of the flip-flop D13 are connected to the input terminal of the second logic gate circuit 113A, and a second output terminal Qn12 of the flip-flop D12 is connected to the input terminal of the second logic gate circuit 113A. The first stop signal Stop1 is outputted after logic processing of the second logic gate circuit 113A. In this embodiment, the second logic gate circuit 113A includes a logic AND gate AND-1. The first stop signal Stop1 is outputted after an output signal from the first output terminal Q11 of the flip-flop D11, an output signal from the first output terminal Q13 of the flip-flop D13, and an output signal from the second output terminal Qn12 of the flip-flop D12 are subjected to AND logic operation by the second logic gate circuit 113A. That is, when the logic level of the output signal from the first output terminal Q11 of the flip-flop D11, the logic level of the output signal from the first output terminal Q13 of the flip-flop D13, and the logic level of the output signal from the second output terminal Qn12 of the flip-flop D12 are all the high levels, the logic level of the first stop signal Stop1 outputted by the first detection subcircuit 113 is the high level, which is a valid signal. In this case, the calibration control circuit 30 can stop outputting the first calibration clock signal Pclk according to the first stop signal Stop1. In other cases, the logic level of the first stop signal Stop1 outputted by the first detection subcircuit 113 is the low level, which is an invalid signal. In this case, the calibration control circuit 30 cannot stop outputting the first calibration clock signal Pclk according to the first stop signal Stop1.

The embodiments of the present disclosure also provide a structure of another first detection subcircuit 113. The first detection subcircuit 113 includes an odd number of flip-flops cascaded and a second logic gate circuit, where second output terminals of the flip-flops of odd-numbered stages are connected to an input terminal of the second logic gate circuit, first output terminals of the flip-flops of even-numbered stages are connected to the input terminal of the second logic gate circuit, and the first stop signal is outputted after logic processing of the second logic gate circuit.

Figure 4B:
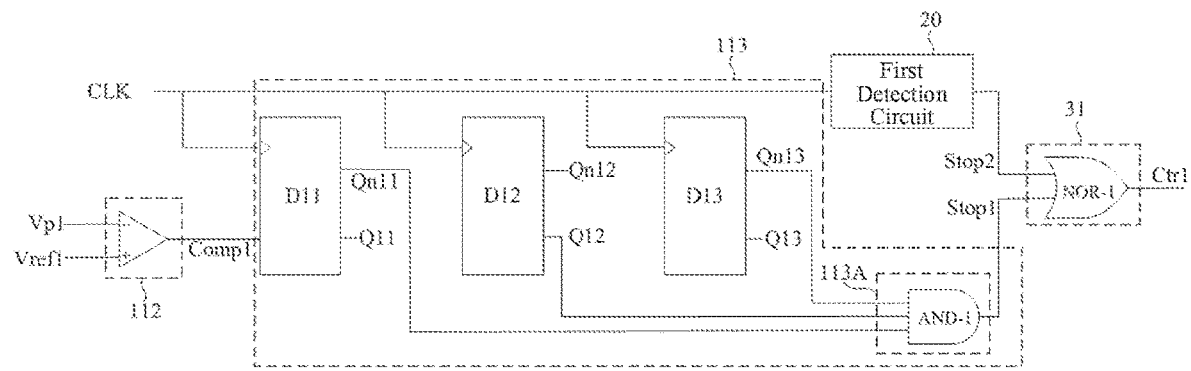
FIG. 4B is a schematic diagram of a first detection subcircuit provided by yet another embodiment of the present disclosure.

In some embodiments, referring to FIG. 4B, which is a schematic diagram of the first detection subcircuit 113 according to another embodiment of the present disclosure. In this embodiment, the first detection subcircuit 113 includes a flip-flop D11, a flip-flop D12, a flip-flop D13 and a second logic gate circuit 113A, where the flip-flop D11, the flip-flop D12 and the flip-flop D13 are cascaded. A second output terminal Qn11 of the flip-flop D11 and a second output terminal Qn13 of the flip-flop D13 are connected to the input terminal of the second logic gate circuit 113A, and a first output terminal Q12 of the flip-flop D12 is connected to the input terminal of the second logic gate circuit 113A. The first stop signal Stop1 is outputted after logic processing of the second logic gate circuit 113A. In this embodiment, the second logic gate circuit 113A includes a logic AND gate AND-1. The first stop signal Stop1 is outputted after an output signal from the second output terminal Qn11 of the flip-flop D11, an output signal from the second output terminal Qn13 of the flip-flop D13, and an output signal from the first output terminal Q12 of the flip-flop D12 are subjected to AND logic operation by the second logic gate circuit 113A. That is, when the logic level of the output signal from the second output terminal Qn11 of the flip-flop D11, the logic level of the output signal from the second output terminal Qn13 of the flip-flop D13, and the logic level of the output signal from the first output terminal Q12 of the flip-flop D12 are all the high levels, the logic level of the first stop signal Stop1 outputted by the first detection subcircuit 113 is the high level, which is a valid signal. In this case, the calibration control circuit 30 can stop outputting the first calibration clock signal Pclk according to the first stop signal Stop1. In other cases, the logic level of the first stop signal Stop1 outputted by the first detection subcircuit 113 is the low level, which is an invalid signal. In this case, the calibration control circuit 30 cannot stop outputting the first calibration clock signal Pclk according to the first stop signal Stop1.

In the above example, the first detection subcircuit 113 includes three flip-flops cascaded. In other embodiment, the first detection subcircuit 113 may further include five flip-flops cascaded or other odd number of flip-flops cascaded, which are all within the scope of the embodiments of the present disclosure.

In some embodiments, the first calibration subcircuit further includes a first calibration code generation subcircuit, where the first calibration code generation subcircuit is configured to update a first calibration code according to the first comparison signal, and the first calibration code is configured for controlling an equivalent resistance of the first resistor element.

In some embodiments, referring to FIG. 2, the first calibration subcircuit 11 further includes a first calibration code generation subcircuit 114, where the first calibration code generation subcircuit 114 is configured to update a first calibration code Pcode<N:0> according to the first comparison signal Comp1, and the first calibration code Pcode<N:0> is configured for controlling the equivalent resistance of the first resistor element 111. In some embodiments, the first calibration code generation subcircuit 114 may be a counter.

According to differences in a magnitude relationship between the second terminal voltage Vp1 of the first resistor element 111 and the first reference voltage Vref1, the first comparison signal Comp1 may be an uplink signal and a downlink signal. For example, when the second terminal voltage Vp1 of the first resistor element 111 is lower than the first reference voltage Vref1, the first comparison signal Comp1 is the downlink signal; and when the second terminal voltage Vp1 of the first resistor element 111 is higher than the first reference voltage Vref1, the first comparison signal Comp1 is the uplink signal. When the first comparison signal Comp1 is the uplink signal, the count value of the first calibration code generation subcircuit 114 is plus 1, and the first calibration code Pcode<N:0> is outputted. The equivalent resistance of the first resistor element 111 is reduced according to the first calibration code Pcode<N:0> to reduce the second terminal voltage Vp1 of the first resistor element 111 until the second terminal voltage Vp1 of the first resistor element 111 is equal to the first reference voltage Vref1. When the first comparison signal Comp1 is the downlink signal, 1 is subtracted from the count value of the first calibration code generation subcircuit 114, and the first calibration code Pcode<N:0> is outputted. The equivalent resistance of the first resistor element 111 is increased according to the first calibration code Pcode<N:0> to increase the second terminal voltage Vp1 of the first resistor element 111 until the second terminal voltage Vp1 of the first resistor element 111 is equal to the first reference voltage Vref1.

In addition to stopping outputting the first calibration clock signal Pclk according to the first stop signal Stop1, the impedance calibration circuit calibration control circuit 30 provided by the embodiments of the present disclosure also stops outputting the first calibration clock signal Pclk according to the second stop signal Stop2, such that the impedance calibration circuit can stop the calibration in time. In this way, the calibration time of the impedance calibration circuit meets the design requirement, the power consumption is effectively reduced, and the reliability of the impedance calibration circuit is improved.

The above only enumerates the case where the calibration circuit 10 includes a calibration subcircuit (the first calibration subcircuit 11). In the case where the calibration circuit 10 includes a plurality of calibration subcircuits, the plurality of calibration subcircuits may perform calibration independently. For example, when a calibration subcircuit completes calibration, another calibration subcircuit may start to perform calibration. Each calibration subcircuit corresponds to a stop signal, such that after the calibration subcircuit completes calibration, the calibration control circuit 30 stops outputting the calibration clock signal corresponding to the calibration subcircuit according to the stop signal.

Figure 5:
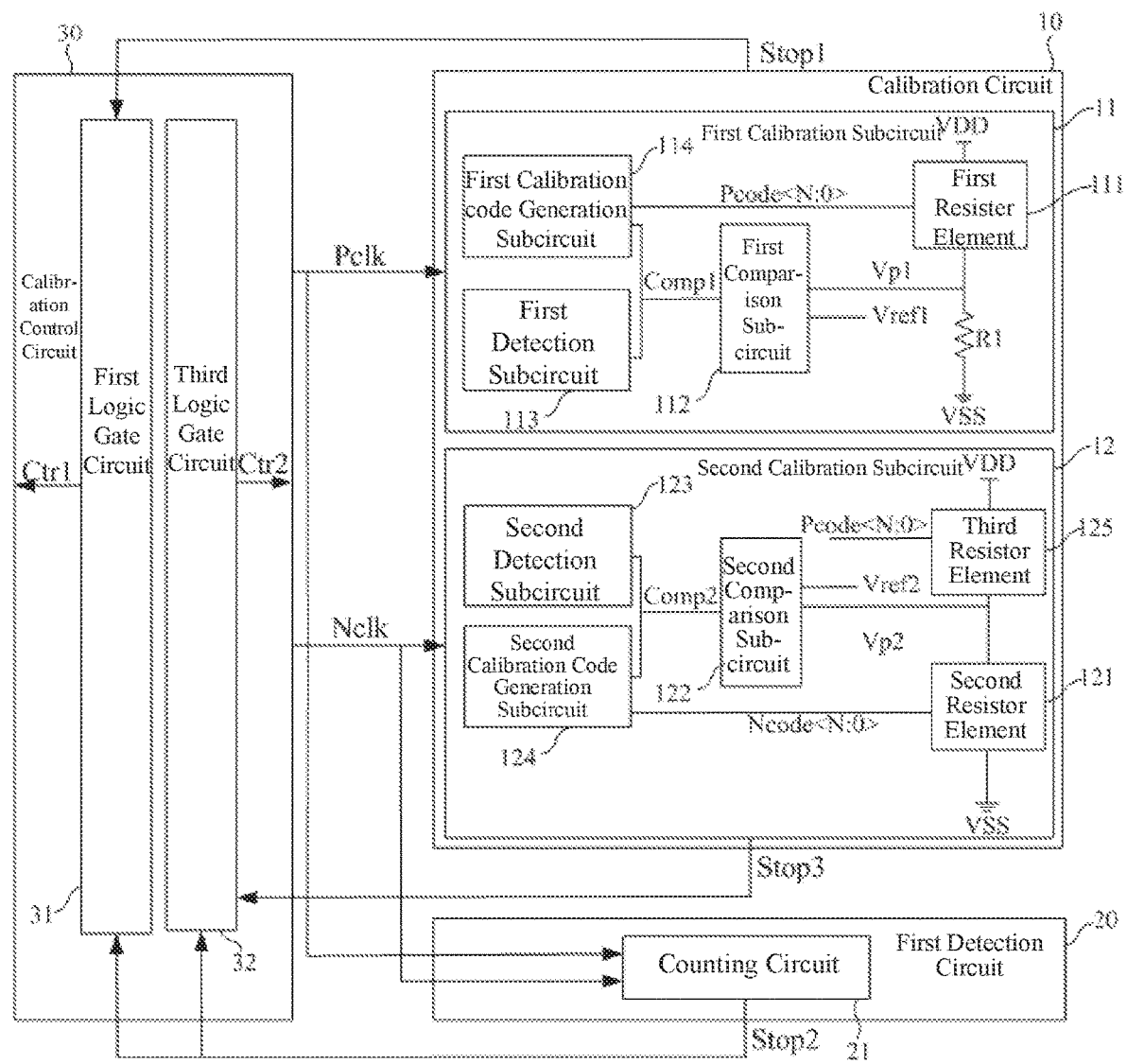
FIG. 5 is a schematic diagram of an impedance calibration circuit provided by yet another embodiment of the present disclosure.

In some embodiments, referring to FIG. 5, which is a schematic diagram of an impedance calibration circuit provided by yet another embodiment of the present disclosure. In this embodiment, the calibration control circuit 30 is further configured to output a second calibration clock signal Nclk. When the calibration control circuit 30 receives the first stop signal Stop1 or the second stop signal Stop2, the calibration control circuit 30 stops outputting the first calibration clock signal Pclk and starts to output the second calibration clock signal Nclk. When the calibration circuit 10 receives the second calibration clock signal Nclk, the calibration circuit 10 performs impedance calibration on the second calibration subcircuit 11. The calibration circuit 10 includes a first calibration subcircuit 11 and a second calibration subcircuit 12. After the first calibration subcircuit 11 completes the calibration, the calibration control circuit 30 stops outputting the first calibration clock signal Pclk corresponding to the first calibration subcircuit 11 according to the first stop signal Stop1 or the second stop signal Stop2. After some time, the calibration control circuit 30 starts to output the second calibration clock signal Nclk corresponding to the second calibration subcircuit 12, such that the second calibration subcircuit 12 can start to perform the impedance calibration. In some embodiments, after the first calibration subcircuit 11 completes the calibration, the calibration control circuit 30 can start to output the second calibration clock signal Nclk corresponding to the second calibration subcircuit 12 without waiting for some time.

When the second calibration subcircuit 12 performs the impedance calibration, the first detection circuit 20 starts to detect calibration time of the second calibration subcircuit 12, and outputs the second stop signal Stop2 when the calibration time reaches the preset value. That is, when the second calibration subcircuit 12 starts to perform calibration, the counting circuit 21 of the first detection circuit 20 counts the second calibration clock signal Nclk, and outputs the second stop signal Stop2 when a count value reaches a preset value, where the count value is number of cycles of the first calibration clock signal Pclk, and the preset value is less than or equal to forty clock cycles of the second calibration clock signal Nclk. In other embodiment, for example, referring to FIG. 6, the counting circuit 21 of the first detection circuit 20 obtains the calibration time for detecting the impedance calibration circuit by counting the initial clock signal CLK-0 of the clock signal generation circuit 40, and outputs the second stop signal Stop2 when a count value reaches a preset value, where the count value is number of cycles of the initial clock signal CLK-0, and the preset value is less than or equal to forty clock cycles of the initial clock signal CLK-0.

The second calibration subcircuit 12 can output a third stop signal Stop3, and the calibration control circuit 30 stops outputting the second calibration clock signal Nclk corresponding to the second calibration subcircuit 12 according to the third stop signal Stop3 or the second stop signal Stop2.

With continued reference to FIG. 5, the calibration control circuit 30 includes a third logic gate circuit 32, where the third logic gate circuit 32 is configured to receive the second stop signal Stop2 and the third stop signal Stop3, and perform logic operation processing to output a second control signal Ctr2, such that the calibration control circuit 30 stops outputting the second calibration clock signal Nclk according to the second control signal Ctr2. A structure and a working principle of the third logic gate circuit 32 are the same as those of the first logic gate circuit 31, and thus are not described in detail here.

With continued reference to FIG. 5, in this embodiment, the second calibration subcircuit 12 includes a second resistor element 121, a third resistor element 125, a second comparison subcircuit 122, and a second detection subcircuit 123.

A second terminal of the second resistor element 121 is connected to the first power terminal VDD. A first terminal of the third resistor element 125 is connected to the first power terminal VDD, a second terminal of the third resistor element 125 is connected to a first terminal of the second resistor element 121, and the first calibration code Pcode<N:0> is further configured for controlling the equivalent resistance of the third resistor element 125. The second comparison subcircuit 122 is configured to compare a first terminal voltage Vp2 of the second resistor element 121 with a second reference voltage Vref2, and to output a second comparison signal Comp2. The second detection subcircuit 123 determines the second comparison signal Comp2 as an input signal, records change of the second comparison signal Comp2, and outputs the third stop signal Stop3 when the change of the second comparison signal Comp2 meets the preset condition. The change and the preset condition of the second comparison signal Comp2 are defined the same as those of the first comparison signal Comp1, and thus detailed descriptions thereof are omitted here.

In this embodiment, the second resistor element 121 may include a plurality of MOS transistors connected in parallel, and the MOS transistors include but are not limited to N-channel Metal Oxide Semiconductor (NMOS) transistors.

The turn-on or turn-off of the MOS transistor is adjusted via the second calibration code Ncode<N:0> to control the equivalent resistance of the second resistor element 121. The first terminal voltage Vp2 of the second resistor element 121 changes with the change of the equivalent resistance of the second resistor element 121. The structure of the third resistor element 125 may be the same as the structure of the first resistor element 111. The equivalent resistance of the third resistor element 125 may be controlled by means of the first calibration code Pcode<N:0>, such that the second resistor element 121 may be calibrated via the third resistor element 125.

In this embodiment, the second comparison subcircuit 122 is a comparator, and its structure may be the same as that of the first comparison subcircuit 112. A positive input terminal of the comparator is configured to receive the second reference voltage Vref2, and a negative input terminal of the comparator is connected to the second resistor element 121 to receive the first terminal voltage Vp2 of the second resistor element 121. The comparator is configured to output the second comparison signal Comp2 in response to the first terminal voltage Vp2 of the second resistor element 121 and the second reference voltage Vref2. When the first terminal voltage Vp2 of the second resistor element 121 is lower than the second reference voltage Vref2, the logic level of the second comparison signal Comp2 outputted by the output terminal of the comparator is the high level. When the first terminal voltage Vp2 of the second resistor element 121 is greater than the second reference voltage Vref2, the logic level of the second comparison signal Comp2 outputted by the output terminal of the comparator is the low level.

The second detection subcircuit 123 determines the second comparison signal Comp2 as the input signal, and outputs the third stop signal Stop3. That is, the third stop signal Stop3 is generated on the basis of the second comparison signal Comp2. However, when the second comparison subcircuit 122 has a lower sensitivity, the second comparison subcircuit 122 cannot output the second comparison signal Comp2 or outputs an incorrect second comparison signal (because the first terminal voltage Vp2 of the second resistor element 121 is closer to the second reference voltage Vref2, the second comparison subcircuit 122 cannot distinguish between the two voltages, and thus cannot output the valid second comparison signal Comp2). Consequently, the impedance calibration circuit cannot generate the third stop signal Stop3 in time, and thus the impedance calibration circuit cannot stop calibration in time. As above, in addition to stopping the impedance calibration process according to the third stop signal Stop3, the calibration control circuit 30 also stops the impedance calibration process according to the second stop signal Stop2, such that the impedance calibration circuit can stop the calibration in time. In this way, the calibration time of the impedance calibration circuit meets the design requirement, the power consumption is effectively reduced, and the reliability of the impedance calibration circuit is improved.

In one embodiment, the structure of the second detection subcircuit 123 is the same as that of the first detection subcircuit 113, referring to FIG. 4A and FIG. 4B, and thus detailed descriptions thereof are omitted here.

In this embodiment, the second calibration subcircuit 12 further includes a second calibration code generation subcircuit 124, where the second calibration code generation subcircuit 124 is configured to update the second calibration code Ncode<N:0> according to the second comparison signal Comp2, and the second calibration code Ncode<N:0> is configured for controlling the equivalent resistance of the second resistor element 121. In some embodiments, the second calibration code generation subcircuit 124 may be a counter.

According to difference in a magnitude relationship between the first terminal voltage Vp2 of the second resistor element 121 and the second reference voltage Vref2, the second comparison signal Comp2 may be an uplink signal and a downlink signal (the downlink signal is outputted when the first terminal voltage Vp2 of the second resistor element 121 is smaller than the second reference voltage Vref2, and the uplink signal is outputted when the first terminal voltage Vp2 of the second resistor element 121 is greater than the second reference voltage Vref2). When the second comparison signal Comp2 is the uplink signal, the count value of the second calibration code generation subcircuit 124 is plus 1, and the second calibration code Ncode<N:0> is outputted. The equivalent resistance of the second resistor element 121 is reduced according to the second calibration code Ncode<N:0> to reduce the first terminal voltage Vp2 of the second resistor element 121 until the first terminal voltage Vp2 of the second resistor element 121 is equal to the second reference voltage Vref2. When the second comparison signal Comp2 is the downlink signal, 1 is subtracted from the count value of the second calibration code generation subcircuit 124, and the second calibration code Ncode<N:0> is outputted to increase the resistance of the second resistor element 121, such that the first terminal voltage Vp2 of the second resistor element 121 is increased until the first terminal voltage Vp2 of the second resistor element 121 is equal to the second reference voltage Vref2. In addition to stopping the impedance calibration process according to the first stop signal Stop1 and the third stop signal Stop3 respectively, the calibration control circuit 30 of the impedance calibration circuit provided by the embodiments of the present disclosure can also stop the impedance calibration process according to the second stop signal Stop2, such that the impedance calibration circuit can stop the calibration in time. In this way, the calibration time of the impedance calibration circuit meets the design requirement, the power consumption is effectively reduced, and the reliability of the impedance calibration circuit is improved.

Figure 6:
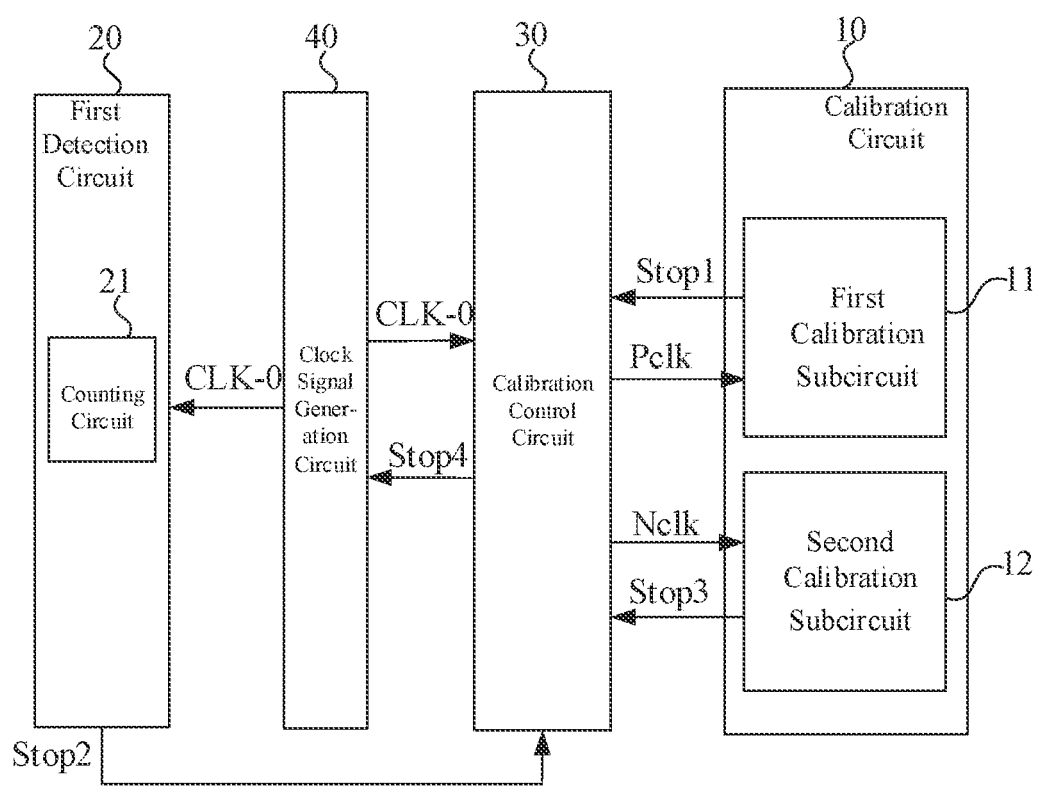
FIG. 6 is a schematic diagram of an impedance calibration circuit provided by yet another embodiment of the present disclosure.

In one embodiment, the impedance calibration circuit further includes a clock signal generation circuit. Referring to FIG. 6, FIG. 6 is a schematic diagram of an impedance calibration circuit provided by yet another embodiment of the present disclosure. In this embodiment, the impedance calibration circuit includes a clock signal generation circuit 40.

The impedance clock signal generation circuit 40 is configured to output the initial clock signal CLK-0. When the initial clock signal CLK-0 is received, the calibration control circuit 30 outputs the first calibration clock signal Pclk and the second calibration clock signal Nclk; and when the calibration circuit 10 performs impedance calibration on the second calibration subcircuit 12, the calibration control circuit 30 outputs the stop signal Stop4 to the clock signal generation circuit 40 when the third stop signal Stop3 or the second stop signal Stop2 is received, such that the clock signal generation circuit 40 stops outputting the initial clock signal CLK-0. In some embodiments, the clock signal generation circuit 40 may be a ring oscillator.

In this embodiment, the first detection circuit 20 is configured to generate the second stop signal Stop2 according to the initial clock signal CLK-0. The first detection circuit 20 includes the counting circuit 21. When the calibration circuit 10 performs the impedance calibration on the first calibration subcircuit 11 and/or when the calibration circuit 10 performs the impedance calibration on the second calibration subcircuit 12, the counting circuit 21 counts the initial clock signal CLK-0, and outputs the second stop signal Stop2 when a count value reaches a preset value. The count value is number of cycles of the initial clock signal CLK-0, and the preset value is less than or equal to forty clock cycles of the initial clock signal CLK-0.

In some embodiments, when the calibration circuit 10 performs impedance calibration on the first calibration subcircuit 11, the counting circuit 21 counts the initial clock signal CLK-0, and outputs the second stop signal Stop2 when the count value reaches the preset value, and the calibration control circuit 30 stops outputting the first calibration clock signal Pclk when the first stop signal Stop1 or the second stop signal Stop2 is received; when the calibration circuit 10 completes calibration on the first calibration subcircuit 11, the counting circuit 21 is reset; and when the calibration circuit 10 performs impedance calibration on the second calibration subcircuit 12, the counting circuit 21 counts the initial clock signal CLK-0, and outputs the second stop signal Stop2 when the count value reaches the preset value, and the calibration control circuit 30 stops outputting the second calibration clock signal Nclk, and outputs the stop signal Stop4 to the clock signal generation circuit 40 when the third stop signal Stop3 or the second stop signal Stop2 is received, such that the clock signal generation circuit 40 stops outputting the initial clock signal CLK-0.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:
1. An impedance calibration circuit, comprising:
a calibration circuit configured to receive a first calibration clock signal, to perform impedance calibration on a basis of the first calibration clock signal, and to output a first stop signal when the calibration is completed;
a first detection circuit configured to detect calibration time of the impedance calibration circuit, and to output a second stop signal when the calibration time reaches a preset value; and
a calibration control circuit configured to receive the first stop signal and the second stop signal and to output the first calibration clock signal, wherein when the first stop signal or the second stop signal is received, the calibration control circuit stops outputting the first calibration clock signal; and
wherein the calibration circuit comprises a first calibration subcircuit, the calibration circuit being configured to perform impedance calibration on the first calibration subcircuit when the first calibration clock signal is received; and the first calibration subcircuit comprises:
a first resistor element having a first terminal connected to a first power terminal;
a reference resistor having a first terminal connected to a second terminal of the first resistor element and a second terminal connected to a second power terminal;
a first comparison subcircuit configured to compare a second terminal voltage of the first resistor element with a first reference voltage, and to output a first comparison signal; and a first detection subcircuit configured to determine the first comparison signal as an input signal, to record change of the first comparison signal, and to output the first stop signal when the change of the first comparison signal meets a preset condition.

2. The impedance calibration circuit according to claim 1, wherein the calibration control circuit comprises a first logic gate circuit, the first logic gate circuit being configured to receive the first stop signal and the second stop signal, and to perform logic operation processing to output a first control signal, and the calibration control circuit being configured to stop outputting the first calibration clock signal according to the first control signal.

3. The impedance calibration circuit according to claim 2, wherein the first logic gate circuit comprises an OR gate.

4. The impedance calibration circuit according to claim 1, wherein the first detection subcircuit comprises an odd number of flip-flops cascaded and a second logic gate circuit, first output terminals of the flip-flops of odd-numbered stages being connected to an input terminal of the second logic gate circuit, second output terminals of the flip-flops of even-numbered stages being connected to the input terminal of the second logic gate circuit, and the first stop signal being outputted after logic processing of the second logic gate circuit.

5. The impedance calibration circuit according to claim 1, wherein the first detection subcircuit comprises an odd number of flip-flops cascaded and a second logic gate circuit, second output terminals of the flip-flops of odd-numbered stages being connected to an input terminal of the second logic gate circuit, first output terminals of the flip-flops of even-numbered stages being connected to the input terminal of the second logic gate circuit, and the first stop signal being outputted after logic processing of the second logic gate circuit.

6. The impedance calibration circuit according to claim 1, wherein the first calibration subcircuit further comprises a first calibration code generation subcircuit, the first calibration code generation subcircuit being configured to update a first calibration code according to the first comparison signal, the first calibration code being configured for controlling an equivalent resistance of the first resistor element.

7. The impedance calibration circuit according to claim 6, wherein the first detection circuit is configured to detect calibration time of the first calibration subcircuit, and to output the second stop signal when the calibration time of the first calibration subcircuit reaches the preset value.

8. The impedance calibration circuit according to claim 7, wherein the calibration control circuit is further configured to output a second calibration clock signal, the calibration circuit being further configured to receive the second calibration clock signal, and the calibration control circuit being configured to stop outputting the first calibration clock signal and start to output the second calibration clock signal when the first stop signal or the second stop signal is received.

9. The impedance calibration circuit according to claim 8, wherein the calibration circuit further comprises a second calibration subcircuit, the calibration circuit being configured to perform impedance calibration on the second calibration subcircuit when the second calibration clock signal is received, the second calibration subcircuit comprising:

a second resistor element having a second terminal connected to the second power terminal;
a third resistor element having a first terminal connected to the first power terminal and a second terminal connected to a first terminal of the second resistor element, wherein the first calibration code is further configured for controlling an equivalent resistance of the third resistor element;
a second comparison subcircuit configured to compare a first terminal voltage of the second resistor element with a second reference voltage, and to output a second comparison signal; and
a second detection subcircuit configured to determine the second comparison signal as an input signal, to record change of the second comparison signal, and to output a third stop signal when the change of the second comparison signal meets a preset condition;
wherein the calibration control circuit is configured to stop outputting the second calibration clock signal when the third stop signal or the second stop signal is received.

10. The impedance calibration circuit according to claim 9, wherein the first detection circuit is further configured to detect calibration time of the second calibration subcircuit, and to output the second stop signal when the calibration time of the second calibration subcircuit reaches the preset value.

11. The impedance calibration circuit according to claim 9, wherein the impedance calibration circuit further comprises a clock signal generation circuit configured to output an initial clock signal, the calibration control circuit being configured to output the first calibration clock signal and the second calibration clock signal when the initial clock signal is received; and when the calibration circuit is configured to perform impedance calibration on the second calibration subcircuit, the calibration control circuit is configured to output a stop signal to the clock signal generation circuit when the third stop signal or the second stop signal is received, such that the clock signal generation circuit stops outputting the initial clock signal.

12. The impedance calibration circuit according to claim 11, wherein the first detection circuit comprises a counting circuit; and when the calibration circuit is configured to perform impedance calibration on the first calibration subcircuit and/or the second calibration subcircuit, the counting circuit is configured to count the initial clock signal, and to output the second stop signal when a count value reaches a preset value.

13. The impedance calibration circuit according to claim 1, wherein the preset value is less than or equal to forty clock cycles.

14. The impedance calibration circuit according to claim 9, wherein the second calibration subcircuit further comprises a second calibration code generation subcircuit, the second calibration code generation subcircuit being configured to update a second calibration code according to the second comparison signal, the second calibration code being configured for controlling an equivalent resistance of the second resistor element.

* * * * *